United States Patent
Sudo

(10) Patent No.: US 10,910,036 B2
(45) Date of Patent: Feb. 2, 2021

(54) SEMICONDUCTOR MEMORY DEVICE

(71) Applicant: Winbond Electronics Corp., Taichung (TW)

(72) Inventor: Naoaki Sudo, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/930,078

(22) Filed: May 12, 2020

(65) Prior Publication Data

US 2020/0365198 A1 Nov. 19, 2020

(30) Foreign Application Priority Data

May 13, 2019 (JP) ................................. 2019-090612

(51) Int. Cl.
| | | |
|---|---|---|
| *G11C 11/407* | (2006.01) | |
| *G11C 11/4074* | (2006.01) | |
| *G11C 5/14* | (2006.01) | |
| *G11C 11/4072* | (2006.01) | |

(52) U.S. Cl.
CPC .......... *G11C 11/4074* (2013.01); *G11C 5/145* (2013.01); *G11C 5/148* (2013.01); *G11C 11/4072* (2013.01)

(58) Field of Classification Search
CPC . G11C 11/4074; G11C 5/148; G11C 11/4072; G11C 5/145
See application file for complete search history.

(56) References Cited

U.S. PATENT DOCUMENTS

| | | | | |
|---|---|---|---|---|
| 5,877,652 A | * | 3/1999 | Oh .................... | G01R 19/16519 327/546 |
| 6,249,473 B1 | * | 6/2001 | Lau ........................ | G11C 11/406 365/193 |
| 8,059,465 B2 | | 11/2011 | Isobe et al. | |
| 9,036,445 B1 | * | 5/2015 | Shin ........................ | G11C 17/18 365/229 |
| 2003/0117875 A1 | * | 6/2003 | Lee .......................... | G11C 7/20 365/226 |
| 2003/0200382 A1 | | 10/2003 | Wells et al. | |
| 2006/0250875 A1 | * | 11/2006 | Hijikata ................. | G11C 5/143 365/226 |

(Continued)

FOREIGN PATENT DOCUMENTS

| | | |
|---|---|---|
| CN | 107993685 A | 5/2018 |
| JP | 6494139 B1 | 4/2019 |
| TW | I473115 B | 2/2015 |

*Primary Examiner* — Khamdan N. Alrobaie
(74) *Attorney, Agent, or Firm* — Birch, Stewart, Kolasch & Birch, LLP

(57) ABSTRACT

A semiconductor memory device, which can reduce consuming power and perform a power-off operation correctly, is provided. A flash memory of the invention includes: a low-power-voltage detection circuit detecting that a supply voltage drops to a given voltage; a high-accuracy voltage detection circuit detecting that the supply voltage drops to the given voltage; and a controller selecting the high-accuracy voltage detection circuit when an internal circuit is in an operation state, selecting the low-power-voltage detection circuit when the internal circuit is in a standby state, and performing a power-off operation in response to a detection result of the low-power-voltage detection circuit or the high-accuracy voltage detection circuit.

10 Claims, 5 Drawing Sheets

(56) References Cited

U.S. PATENT DOCUMENTS

| | | | |
|---|---|---|---|
| 2007/0041257 A1* | 2/2007 | Kim | G11C 7/08 |
| | | | 365/207 |
| 2008/0112250 A1* | 5/2008 | Freebern | G11C 7/1078 |
| | | | 365/227 |
| 2014/0153343 A1* | 6/2014 | Kim | G11C 7/062 |
| | | | 365/189.06 |
| 2017/0011780 A1* | 1/2017 | Kim | H03K 17/223 |

* cited by examiner

SEMICONDUCTOR MEMORY DEVICE

CROSS REFERENCE TO RELATED APPLICATIONS

This Application claims priority of Japanese Patent Application No. 2019-090612, filed on May 13, 2019, the entirety of which is incorporated by reference herein.

BACKGROUND OF THE INVENTION

Field of the Invention

The present invention relates to a semiconductor memory device such as a flash memory, and more particularly to a power down detection.

Description of the Related Art

An NAND flash memory uses fuse cells to store voltage settings for reading, programming, and erasing data or setting information such as user options. The fuse cells are configured in a memory area that is not accessible by the user in the memory array. When the flash memory is powered, the setting information is read from the fuse cells for a power-up operation, and the setting information is loaded into an internal register. After the power-up operation is completed, the controller controls the various operations based on the setting information held in the internal register (Patent Document 1).

PREVIOUS TECHNICAL DOCUMENTS

Patent Documents

[Patent Document 1] Japanese Patent No. 6494139.

BRIEF SUMMARY OF THE INVENTION

Problems to be Solved by the Invention

A power-on detection operation performed when a power supply is applied to a flash memory and a power-off detection operation performed when the power supply is cut off are described with reference to FIG. 1. FIG. 1 shows the relationship between the voltage supplied from the outside and the time.

For example, in a flash memory to which a voltage of 3.0 V is supplied, when the operation guarantee voltage is in a range of 2.7V-3.3V a power-up detection portion detects a power-up voltage level V_PU of about 2.2V which serves as a voltage for starting the power-on operation when the power supply is applied. The power-on detection portion initially uses a detection circuit having a relatively low accuracy to detect that the supplied voltage has reached a certain voltage and, secondly, uses a detection circuit having a relatively high accuracy to detect that the supplied voltage reaches the power-on voltage level V_PU. The high-accuracy detection circuit comprises a reference voltage generation circuit or a comparison circuit for comparing a reference voltage with the supplied voltage. When the power-up voltage level V_PU is detected, the power-up procedure is executed. The internal circuit is initialized (reset), and the setting information read from the fuse cells of the memory array is set in the register. Then, if the supplied voltage rises to the operation guaranteed voltage, the normal operation begins.

FIG. 2 shows a conventional power-off detection portion. When the power-off detection portion 10 detects that the supplied voltage Vcc has fallen to the power-off voltage level V_PD, it outputs a reset signal to an internal circuit 20 such as a central processing unit or a logic circuit. For example, when the capability of externally supplying power is low or a peak current larger than currents induced during the operation of the internal circuit 20 occurs, the supplied voltage Vcc falls to the power-off voltage level V_PD. After receiving the reset signal from the power-off detection portion 10, the internal circuit 20 performs a power-off operation, stops the operation of the charge pump circuit of the internal circuit 20, and performs the resetting of the central processing unit or logics.

The power-off voltage level V_PD is lower than the power-on voltage level V_PU (if not, the power-off operation will be performed after the power-on operation, such that the flash memory cannot operate. Moreover, both of the power-off voltage level V_PD and the power-on voltage level V_PU are set to be higher than the operation voltage Vt of the CMOS (complementary metal oxide semiconductor) of the internal circuit (for example, the operation voltage Vt is the total value of the threshold value of the PMOS (P-type metal oxide semiconductor) and the threshold of the NMOS (N-type metal oxide semiconductor) (if not, the power-on operation or the power-off operation is performed correctly).

In addition, when the flash memory is in a standby state, the consumption current that is tolerable in this state is defined by the specification. Due to the restriction, the configuration of the power-off detection portion 10 minimize the operation current, and the operation current does not exceed the consumption current tolerated in the standby state. For example, as shown in FIG. 3, the power-off detection portion 10 comprises a simple circuit composed of a resistance-type voltage divider and an inverter and outputs a detection signal Vdet with an H level when detecting the power-off voltage level V_PD.

Since the power-off detection portion 10 does not comprise the reference voltage generation circuit or the comparison circuit of the power-on detection portion, the power consumption can be reduced, but conversely, the detection accuracy of the power-off detection portion 10 is worse than the power-on detection unit. Therefore, as shown in FIG. 1, the variation in the detection range H2 of the power-off detection portion is larger than the variation of the detection range H1 of the power-on detection portion.

In the cases where the power-off detection portion 10 is used, since the variation of the detection range H2 is large, there is always a problem that the power-off voltage level V_PD cannot be detected accurately. If the flash memory is in the standby state, even if there is a slight error in the detection range of the power-off voltage level V_PD, no particular influence is induced. However, if the internal circuit cannot correctly detect the power-off voltage level V_PD in a busy state during the internal circuit is operating, the power-off voltage bit, it is likely to cause serious problems for the flash memory. For example, during the programming operation or erasing operation, even if the supplied voltage drops below the power-off voltage level V_PD, the power-off operation cannot be started. Due to the wrong operation, a high voltage may be supplied to unexpected circuits, which cases the circuits to be failed, or the data is incorrectly programmed in the memory cells, such that the original data is destroyed.

An object of the present invention is to solve the above conventional problems and to provide a semiconductor memory device capable of reducing power consumption and correctly performing a power-off operation.

Means to Solve the Problem

A semiconductor memory device is provided according to the present invention. The semiconductor memory device comprises a first detection circuit, a second detection circuit, a selection device, and an execution device. The first detection circuit detects that a supply voltage drops to a given. The second detection circuit has higher detection accuracy than the first detection circuit and detects that the supply voltage drops to the given voltage. The selection device selects the second detection circuit when the internal circuit is in an operation state and selects the first detection circuit when the internal circuit is in a standby state. The execution device performs a power-off operation in response to a detection result of the first detection circuit or the second detection circuit.

Effect of the Invention

According to the present invention, when the internal circuit is in an operation state, the second detection circuit is selected, and when the internal circuit is in a standby state, the first detection circuit is selected. I response to the selection result of the selected first detection circuit or second detection circuit, the power-off operation is performed. Thus, the power consumption can be reduced, and the power-off operation can be performed correctly.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Next, embodiments of the present invention will be described in detail with reference to the drawings. Preferably, a semiconductor memory device of the present invention is a non-volatile memory, such as a NAND-type or a NOR-type flash memory, a variable resistance memory, and a magnetoresistive random access memory. In the following description, a NAND type flash memory is given as example.

Embodiments

Figure 4:
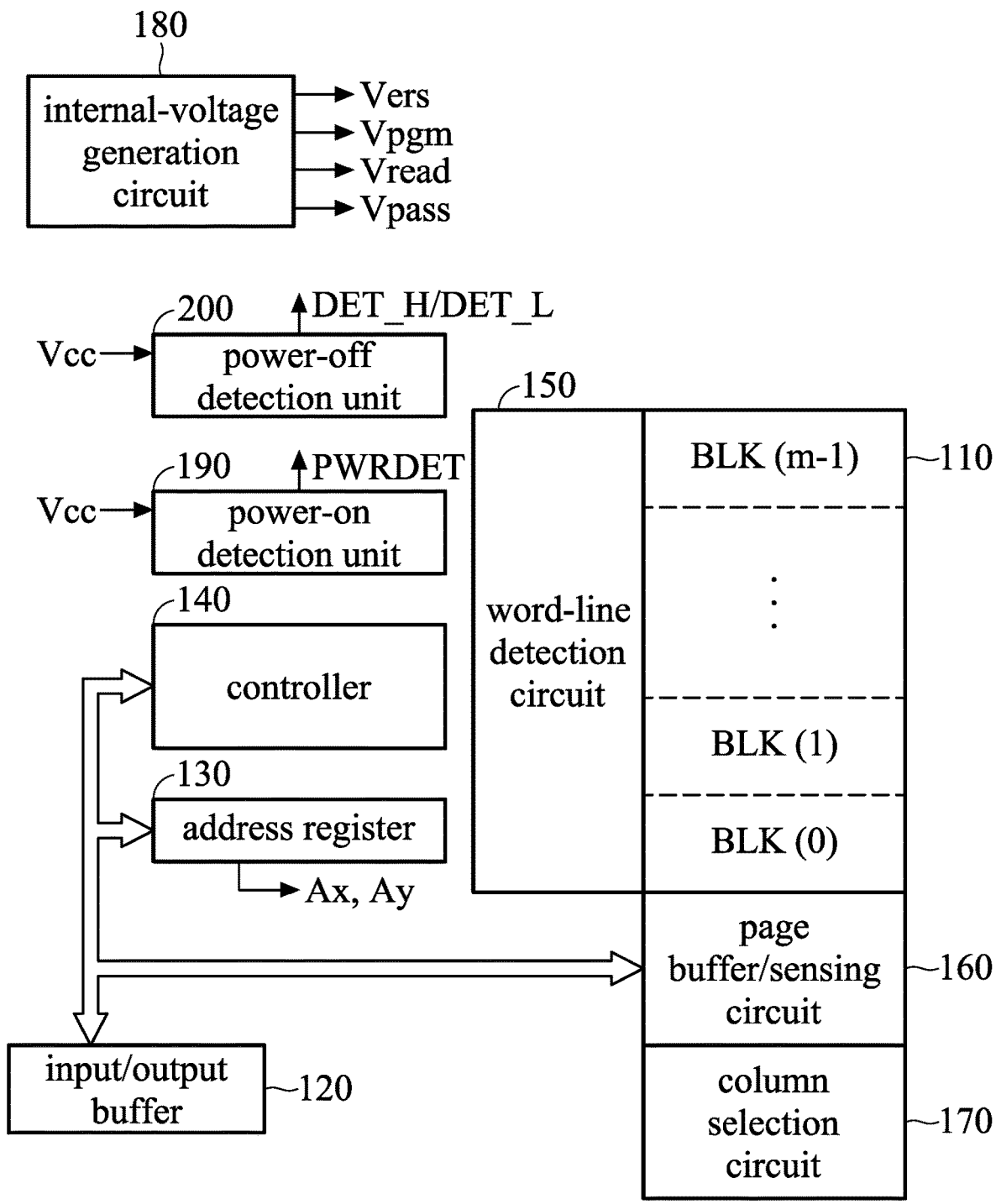
FIG. 4 is a block diagram of an internal structure of a flash memory according to an exemplary embodiment of the present invention.

A schematic configuration of a flash memory according to an embodiment of the present invention is shown in FIG. 4. The flash memory 100 of the embodiment comprises a memory cell array 110, an input/output buffer 120, an address register 130, a controller 140, a word-line selection circuit 150, a page buffer/sensing circuit 160, a column selection circuit 170, an internal-voltage generation circuit 180, a power-on detection unit 190, and a power-off detection unit 200. The memory cell array 110 comprises a plurality of memory cells arranged in a matrix. The input/output buffer 120 is connected to an external input/output terminal I/O. The address register 130 receives address data from the input/output buffer 120. The controller 140 receives instruction data from the input/output buffer 120 and controls each unit/circuit. The word-line selection circuit 150 receives row address information Ax from the address register 130, decodes the row address information Ax, and further performs a block selection and word-line selection based on the decoding result. The page buffer/sensing circuit 160 maintains the data read from the page selected by the word-line selection circuit 150 while maintaining input data which will be programmed to the selected page. The column selection circuit 170 receives the column address information Ay from the address register 130, decodes the column address information Ay, and selects the data in the page buffer/sensing circuit 160 at the column address based on the decoded result. The internal-voltage generation circuit 180 generates various voltages necessary for reading, programming, and erasing data (the write voltage Vpgm, the passing voltage Vpass, the read-passing voltage Vread, the erase voltage Vers). The power-on detection unit 190 monitors the supply voltage Vcc from the external terminal during the period when the power supply is applied, detects the power-on voltage level V_PU, and outputs a power-on detection signal PWRDET. The power-off detection unit 200 monitors the supply voltage Vcc, detects the power-off voltage level V_PD, and outputs a power-off detection signal DET_H/DET_L.

The memory cell array 110 comprises m blocks BLK(0), BLK(1), . . . , BLK(m−1) arranged in the column direction. A plurality of NAND strings are formed in one block, and each NAND string is composed of a plurality of memory cells connected in series. The NAND strings may be formed in the two-dimension or the three-dimension on the surface of the substrate. In addition, each memory cell may be a single-level cell type (SLC) that memorizes one bit (two-value data), or may be a multi-level cell (MLC) that memorizes multi bits. One NAND string is configured by connecting a plurality of memory cells (for example, 64 memory cells), bit-line side selection transistors, and source-line side selection transistors in series. The drain of one bit-line side selection transistor is coupled to one bit line GBL. The source of the source-line side selection transistor is coupled to a common source line SL.

During the read operation, a certain positive voltage is applied to the bit lines, a certain voltage (for example, 0 V) is applied to the selected word lines, and a passing voltage Vpass (for example, 4.5 V) is applied to the unselected word lines, and a positive voltage (for example, 4.5 V) is applied to the selected gate lines SGD and SGS, so that the bit-line side selection transistors and the source-line side selection transistors of the NAND strings are turned on. Moreover, 0 V is applied to the common source line. During the program (write) operation, a high voltage program voltage Vpgm (15V-20V) is applied to the selected word lines, and an intermediate voltage (for example, 10 V) is applied to the unselected word lines, so that the bit-line side selection transistors are turned on and the source-line side selection transistors are turned off, and the voltage corresponding to "0" or "1" is supplied to each bit line. During the erase operation, 0V is applied to the selected word lines in the blocks, a high voltage (for example, 20V) is applied to the P-well region, and the floating-gate electrons are pulled out from the substrate, thereby erasing the data in one unit of block.

When the power-on detection unit 190 detects that the supply voltage Vcc, which is supplied to the flash memory 100 when the power supply is applied, reaches the power-on voltage level V_PU, the power-on detection unit 190 outputs the power-on detection signal PWRDET to the controller 140. The controller 140 comprises, for example, a central processing unit or a read-only memory/random access memory, etc. The read-only memory/random access memory stores codes, such as instructions or data for executing the power-on operation, the power-off operation, the read operation, the program operation, the erase program, and the like. When receiving the power-up detection signal PWRDET, the controller 140 executes the power-up operation according to the codes read from the read-only memory/random access memory in response to the power-up detection signal PWRDET. During the power-on operation, the resetting the internal circuits including the controller 140 is performed or the reading of the fuse cells of the memory cell array 110 is performed.

When detecting that the supply voltage Vcc has fallen to the power-off voltage level V_PD, the power-off detection unit 200 outputs the power-off detection signal DET_L or DET_H to the controller 140 in response to the operation state of the flash memory 100. After receiving the power-off detection signal DET_L/DET_H, the controller 140 performs a power-off operation according to the codes read from the read-only memory/random access memory in response to the power-off detection signal DET_L/DET_H. During the power-off operation, the resetting the internal circuit including the controller 140 or stopping the charge pump circuit is performed.

Figure 1:
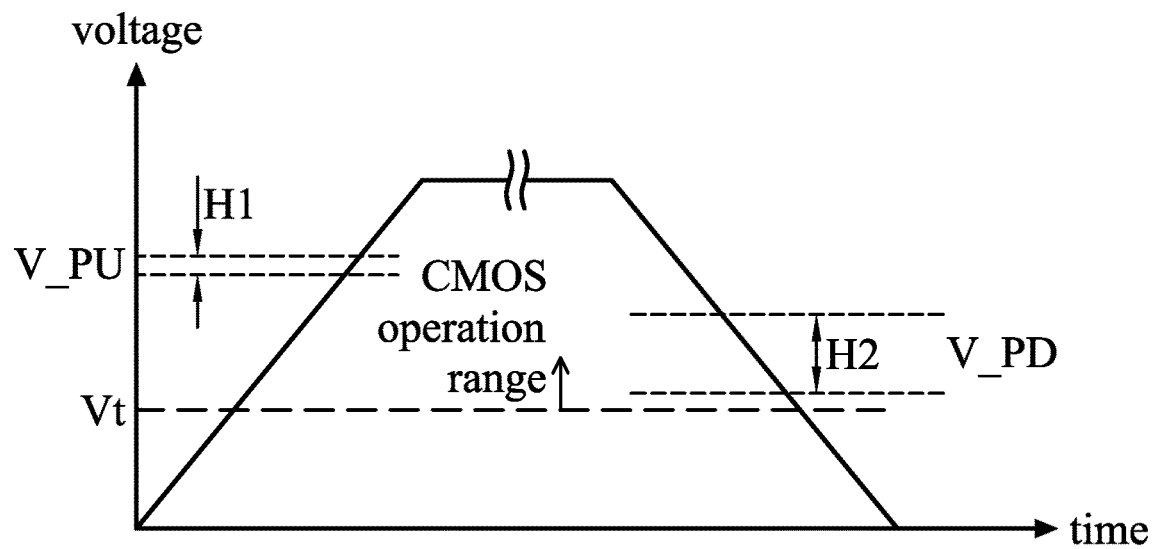
FIG. 1 is a schematic view showing a power-on detection operation and a power-off detection operation of a flash memory.
Figure 2:
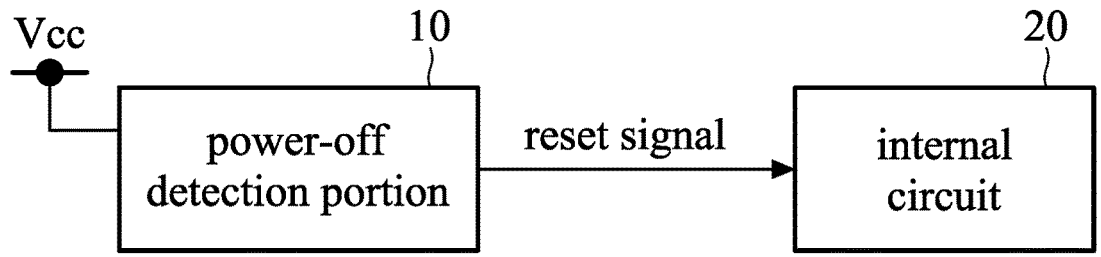
FIG. 2 shows a conventional power-off detecting portion.
Figure 3:
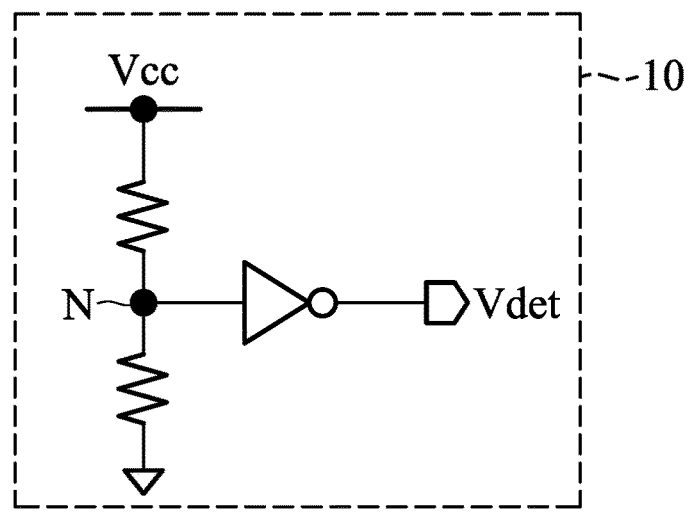
FIG. 3 shows an example of a configuration of a conventional power-off detection portion.
Figure 5:
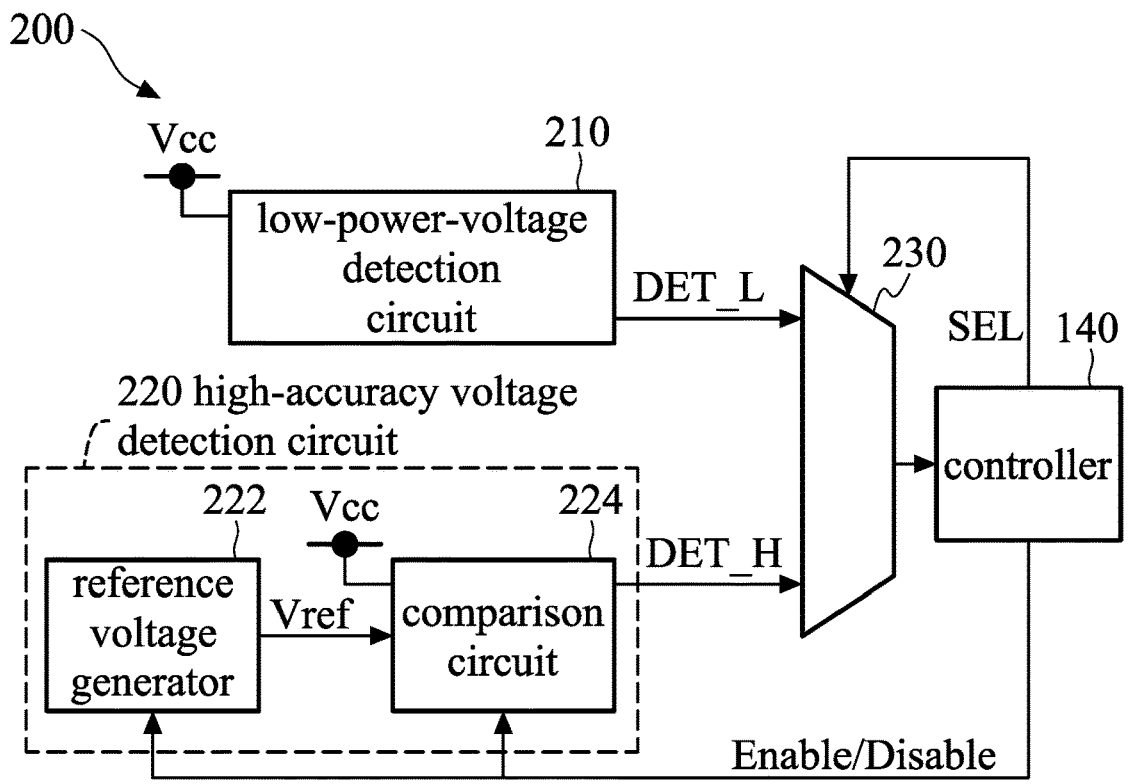
FIG. 5 shows a configuration of a power-off detection unit according to an exemplary embodiment of the present invention.

FIG. 5 shows the internal configuration of the power-off detection unit 200 of the present embodiment. As shown in FIG. 5, the power-off detection unit 200 comprises a low-power-voltage detection circuit 210, a high-accuracy voltage detection circuit 220, and a selector 230. The low-power-voltage detection circuit 210 is implemented by a relatively simple circuit and is composed of a circuit that can reduce power consumption. For example, as shown in FIG. 3, the low-power-voltage detection circuit 210 is composed of a detection circuit 10 comprising resistors and an inverter. The detection circuit 10 constantly monitors the supply voltage Vcc. The magnitude of the resistance of the detection circuit 10 is selected such that when the detection node N has fallen to the power-off voltage level V_PD, the voltage of the detection node N becomes below the threshold voltage of the inverter. In this way, when detecting that the supply voltage Vcc falls to the power-off voltage level V_PD, the low-power-voltage detection circuit 210 outputs the detection signal DET_L with the H-level, which indicates the detection result to the selector 230 (corresponding to the detection signal Vdet off FIG. 3).

The high-accuracy voltage detection circuit 220 comprises a reference voltage generator 222 that generates a reference voltage Vref and further comprises a comparison circuit 224 that compares the reference voltage Vref generated by the reference voltage generator 222 with the supply voltage Vcc. The reference voltage Vref is set as the power-off voltage level V_PD. When the supply voltage Vcc falls below the power-off voltage level V_PD, the comparison circuit 224 outputs the detection signal DET_H with the H level, indicates this situation, to the selector 230.

Figure 6:
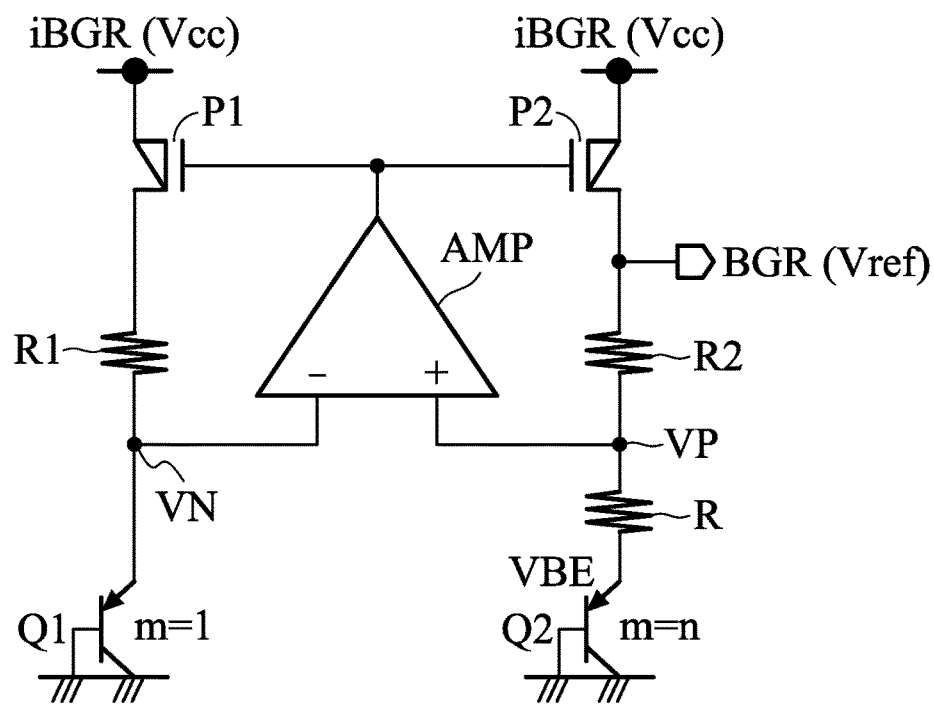
FIG. 6 shows a reference voltage generation circuit according to an exemplary embodiment of the present invention.

The configuration of the reference voltage generation circuit 222 is not particularly limited. For example, a band gap reference (BGR) circuit that hardly depends on variation in the supply voltage or operation temperature is used to implement the reference voltage generation circuit 222. FIG. 6 6 shows a bandgap reference circuit. As shown in FIG. 6, the bandgap reference circuit comprises a first current path and a second current path which are between the supply voltage Vcc (iBGR) and the ground GND. The bandgap reference circuit further comprises a PMOS transistor P1, a resistor R1, and a bipolar transistor Q1 which are connected in series in the first current path. The bandgap reference circuit further comprises a PMOS transistor P2, resistors R2 and R, and a bipolar transistor Q2 which are connected in series in the second current path. The bandgap reference circuit further comprises a differential amplifier circuit AMP which has an inverting input terminal (−) is connected to the common node VN of the resistor R1 and the transistor Q1, a non-inverting input terminal (+) connected to the common node VP of the resistor R2 and the resistor R, and an output terminal connected to the gates of the transistors P1 and P2. The differential amplifier circuit AMP adjusts the output voltage such that the forward voltage of the transistor Q1 is equal to the voltage obtained by adding the forward voltage of the transistor Q2 to the voltage generated by the resistor R, and outputs the reference voltage Vref from the output node BGR.

Figure 7:
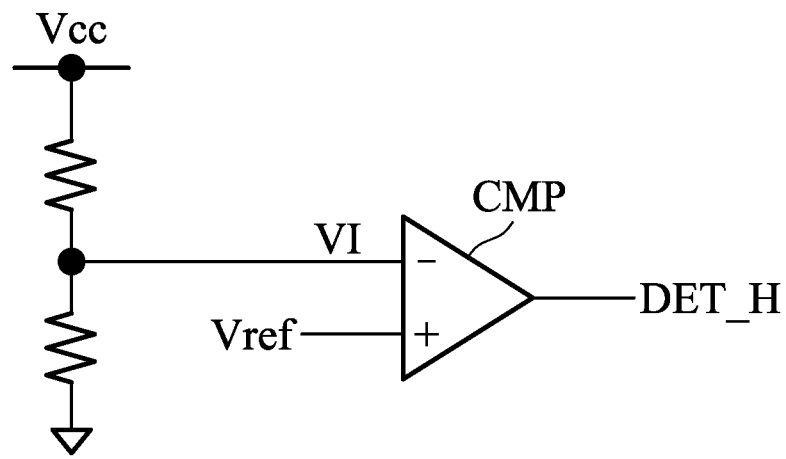
FIG. 7 shows a high-accuracy voltage detection circuit according to an exemplary embodiment of the present invention.

The configuration of the comparison circuit 224 is not particularly limited. For example, as shown in FIG. 7, the comparison circuit 224 comprises a comparator CMP for comparing the internal voltage VI generated by the supply voltage Vcc with the reference voltage Vref. The reference voltage Vref is set to be equal to the power-off voltage level V_PD. When VI>Vref, the comparator CMP outputs the detection signal DET_H with the L level; when Vref≥VI, the comparator CMP outputs the detection signal DET_H with the H level.

The reference voltage generator 222 and the comparison circuit 224 operate or do not operate in response to an Enable/Disable signal from the controller 140. As described later, when the flash memory is in the busy state, the controller 140 outputs the Enable signal to activate the high-precision voltage detection circuit 220 to operate. When the flash memory is in the standby state, the controller

140 outputs the Disable signal to deactivate the high-accuracy voltage detection circuit 220 such that the high-accuracy voltage detection circuit 220 does not operate.

The selector 230 receives the detection signal DET_L from the low-power-voltage detection circuit 210 and the detection signal DET_H from the high-accuracy voltage detection circuit 220, selects one of the detection signals based on the selection signal SEL from the controller 140, and outputs the selected detection signal to the controller 140. In the busy state, the controller 140 causes the selector 230 to select the detection signal DET_H form the high-accuracy voltage detection circuit 220; in the standby state, the controller 140 causes the selector 230 to select the detection signal DET_L from the low-power voltage detection circuit 210.

Figure 8:
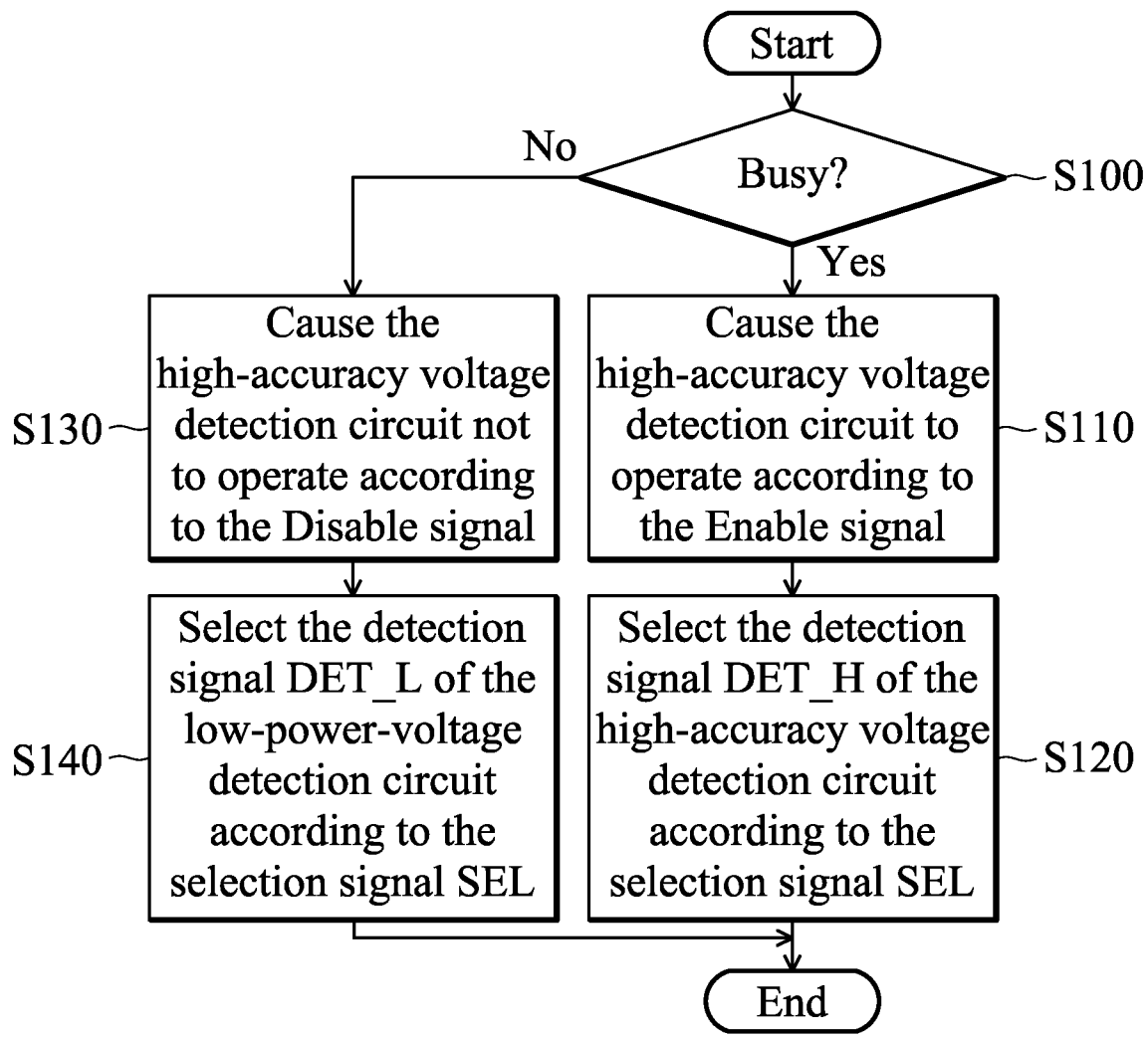
FIG. 8 is a schematic view showing an operation of a power-off detection unit according to an exemplary embodiment of the present invention.

Next, controlling the power-off detection unit 200 by the controller 140 will be described. FIG. 8 is a flow chart showing the operation of controlling the power-off detection unit 200 by the controller 140. The controller 140 determines whether the flash memory 100 is in a busy state (S100). The so-called busy state is a state in which the internal circuit (including the controller or peripheral circuits) of the flash memory 100 is operating, for example, a state in which instructions are received from a user, and the read operation, the program operation, or the erase operation are performed based on the instructions. The so-called standby state is a state in which the internal circuit is not operating, for example, the internal circuit can receive instructions from a user.

When determining that the flash memory 100 is in a busy state, the controller 140 outputs the Enable signal to cause the high-accuracy voltage detection circuit 220 to operate (S110). According to the selection signal SEL, the selector 230 selects the detection signal DET_H of the high-accuracy voltage detection circuit 220 (S120). That is, in the busy state, both the low-power-voltage detection circuit 210 and the high-accuracy voltage detection circuit 220 are operating, and the detection signal DET_H of the high-accuracy voltage detection circuit 220 is provided to the controller 140 from the selector 230.

On the other hand, when determining that the flash memory is not in the busy state, that is, when determining that the flash memory is in the standby state, the controller 140 outputs the disable signal to cause the high-accuracy voltage detection circuit 220 not to operate (S130). According to the selection signal SEL, the selector 230 selects the detection signal DET_L of the low-power-voltage detection circuit 210 (S140). That is, only the low-power-voltage detection circuit 210 operates in the standby state, and the detection signal DET_L of the low-power-voltage detection circuit 210 is provided to the controller 140 by the selector 230.

Figure 9:
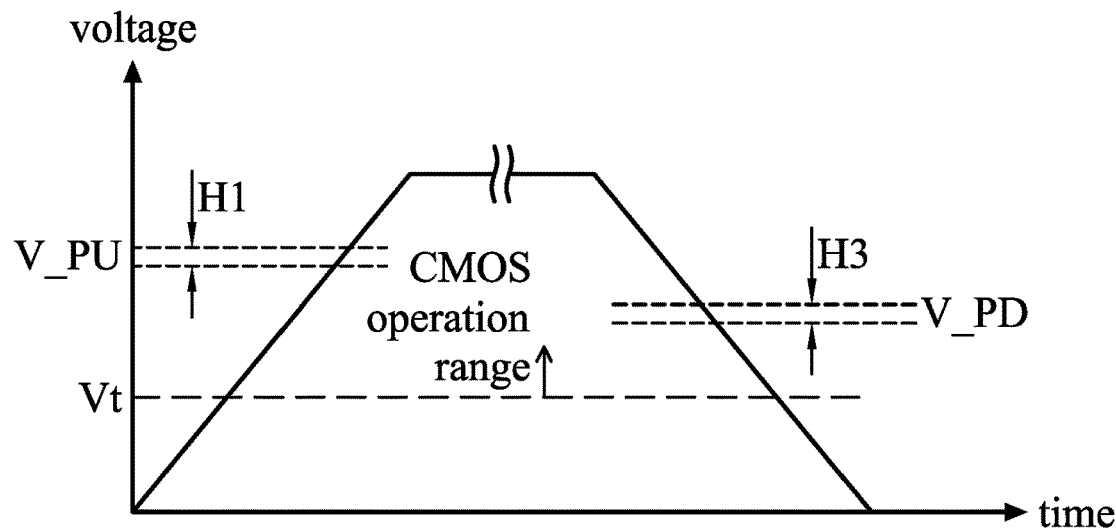
FIG. 9 shows variation of a detection range of a power-off detection unit in a busy state according to an exemplary embodiment of the present invention.

FIG. 9 shows the detection range H3 of the power-off voltage level V_PD in the busy state according to an exemplary embodiment. As described above, in the busy state, since the power-off voltage level V_PD is detected by using the high-accuracy voltage detection circuit 220, the detection accuracy is higher than the detection accuracy induced when it is detected by using the low-power-voltage detection circuit 210, so that the variation of the detection range H3 becomes smaller. In the busy state, the internal circuit is operating. During this period, the power-off voltage level V_PD is correctly detected, thereby suppressing the situation in which the internal circuit operates at a voltage lower than the power-off voltage level V_PD. Thus, the circuit failure or data corruption induced due to incorrect operation can be prevented. On the other hand, in the standby state in which the internal circuit is not operating, the high-accuracy voltage detection circuit 220 does not operate, and only the low-power-voltage detection circuit 210 operates, so that the limitation of the tolerable power consumption in the standby state can be observed.

For the detection of the power-on voltage level V_PU, the power-on detection unit 190 is also required to have high precision. Therefore, the power-on detection unit 190 also uses a high-accuracy voltage detection circuit, and the high-accuracy voltage detection circuit uses a reference voltage generator or a comparison circuit. Therefore, the high-accuracy voltage detection circuit 220 of the power-off detection unit 200 can also use the high-accuracy voltage detection circuit of the power-on detection unit 190. In this case, after the power-on procedure is completed, the detection level of the high-accuracy voltage detection circuit is changed to the power-off voltage level V_PD from the power-on voltage level V_PU.

Next, another embodiment of the present invention will be described. In the above embodiments, an example in which the high-accuracy voltage detection circuit 220 is activated to operate in the busy state is shown. In the present embodiment, the operation of the high-accuracy voltage detection circuit 220 is controlled in response to more detailed operation in the busy state.

Figure 10:
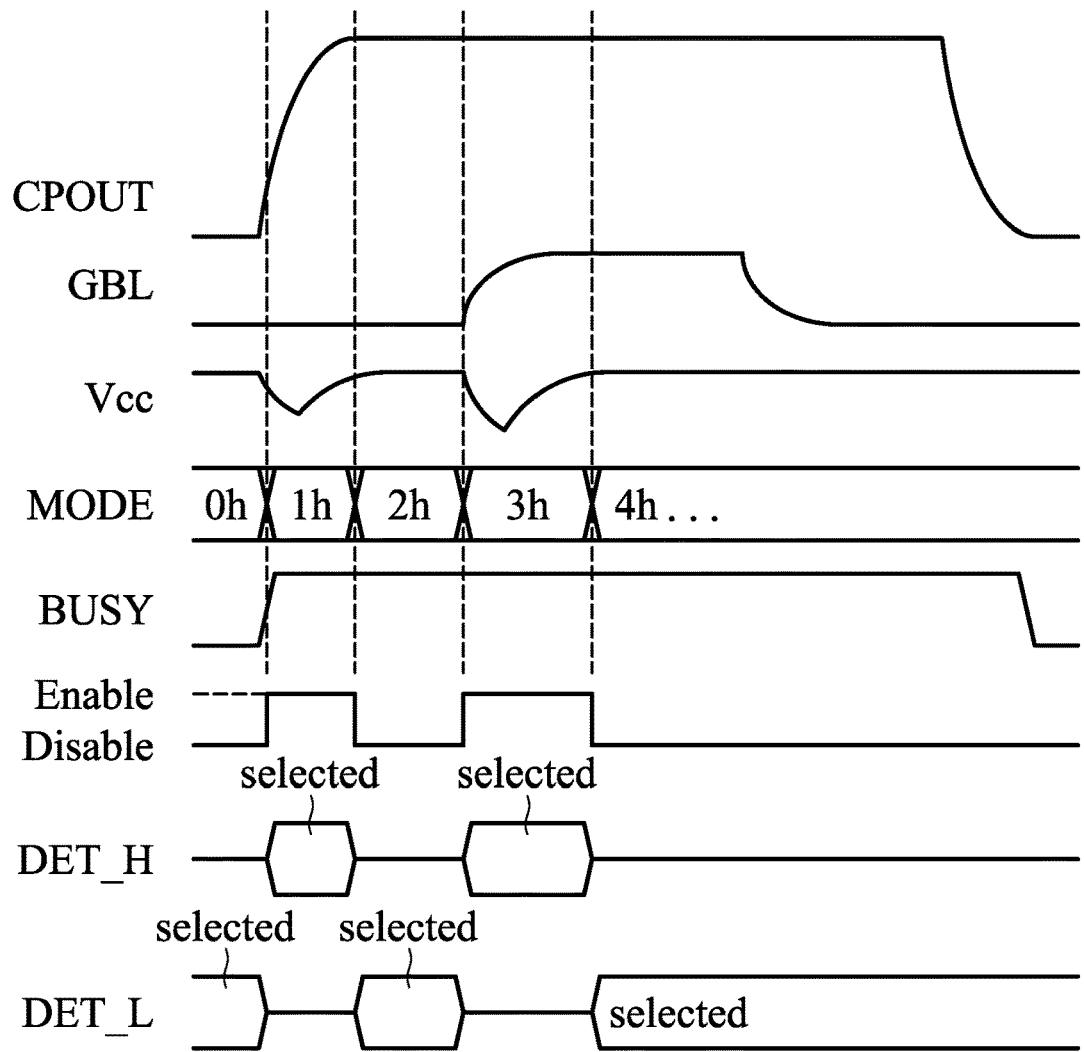
FIG. 10 is schematic view showing an operation of a power-off detection unit according to another exemplary embodiment of the present invention.

FIG. 10 shows the waveforms of the respective portions during the read operation of the flash memory. The controller 140 starts the read operation in response to a read command or addresses input from the outside. MODE indicates the detailed operation mode. For example, MODE "1h" indicates a period in which the charge pump circuit is activated; MODE "3h" indicates a period in which pre-charging of the global bit line GBL is started. BUSY indicates the period during which the controller 140 performs the read operation. During the "1h" period in which the charge pump circuit is activated, since the peak current is generated during the period in which the global bit line GBL is pre-charged, the supply voltage Vcc decreases at a time.

In the previous embodiment, when the BUSY signal is at a H level, the controller 140 causes the high-accuracy voltage detection circuit 220 to operate and performs a power-off operation based on the detection signal DET_H. In the embodiment, during the busy period, when the controller 140 performs the specific operations corresponding to the MODE "1h" and "3h", the controller 140 activates the high-accuracy voltage detection circuit 220 to operate. By performing such operation control, it is possible to further reduce the power consumption.

In the above-described embodiment, the controller 140 determines whether a busy state is occurred and causes the high-accuracy voltage detection circuit to operate. However, in the busy state, for example, when the flash memory has an external terminal for outputting a busy signal or a ready signal, the controller 140 can also determine whether a busy state or a ready state in response to the busy signal or the ready signal. Further, in the above embodiments, the NAND-type flash memory is exemplified, but the present invention is not limited thereto and can be applied to a power-off detection of other non-volatile memories.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device comprising:
    a first detection circuit detecting that a supply voltage drops to a given voltage;
    a second detection circuit having a higher detection accuracy than the first detection circuit and detecting that the supply voltage drops to the given voltage;
    a selection device selecting the second detection circuit when an internal circuit is in an operation state and selecting the first detection circuit when the internal circuit is in a standby state; and
    an execution device performing a power-off operation in response to a detection result of the first detection circuit or the second detection circuit.

2. The semiconductor memory device as claimed in claim 1, wherein the second detection circuit comprises:
    a reference voltage generation circuit generating a reference voltage; and
    a comparison circuit comparing the reference voltage and the supply voltage,
    wherein the first detection circuit does not comprise the reference voltage generation circuit.

3. The semiconductor memory device as claimed in claim 1,
    wherein the operation state comprises a state in which the internal circuit operates based on an instruction from the outside, and
    wherein the standby state comprises a state in which an instruction from the outside can be accepted.

4. The semiconductor memory device as claimed in claim 1,
    wherein the operation state is a busy state of a flash memory, and
    wherein the standby state is a ready state of the flash memory.

5. The semiconductor memory device as claimed in claim 4,
    wherein the busy state is specified according to a busy signal output from an external terminal, and
    wherein the standby state is specified according to on a ready signal output from the external terminal.

6. The semiconductor memory device as claimed in claim 1, wherein the selection device selects the second detection circuit when the internal circuit is in the operation state and a specific operation which is determined in advance is performed.

7. The semiconductor memory device as claimed in claim 6, wherein the selection device selects the second detection circuit in response to a command code related to the specific operation performed by the controller.

8. The semiconductor memory device as claimed in claim 6, wherein among them, the specific operation is an operation of a charge pump circuit.

9. The semiconductor memory device as claimed in claim 6, wherein the specific operation is a pre-charging operation of bit lines when reading of a selected page of a memory cell array.

10. The semiconductor memory device as claimed in claim 1, wherein a voltage level detected by the first detection circuit and the second detection circuit is lower than a voltage level detected by a power-on detection circuit and higher than a voltage level at which a complementary metal oxide semiconductor can operate.

* * * * *